United States Patent [19]
Shibusawa et al.

[11] Patent Number: 5,763,940
[45] Date of Patent: Jun. 9, 1998

[54] TAPE MOUNTED SEMICONDUCTOR APPARATUS

[75] Inventors: Yuko Shibusawa; Takeshi Sasaki, both of Kanagawa-ken, Japan

[73] Assignee: Kabushiki Kaisha Toshiba, Kanagawa-ken, Japan

[21] Appl. No.: 454,721

[22] Filed: May 31, 1995

[51] Int. Cl.⁶ .................... H01L 23/495; H01L 29/04; H01L 23/28
[52] U.S. Cl. .................. 257/668; 257/59; 257/72; 257/666; 257/787
[58] Field of Search .................. 257/668, 59, 72, 257/666, 787

[56] References Cited

U.S. PATENT DOCUMENTS 3,984,739  10/1976  Mochizuki et al. ............ 257/668

FOREIGN PATENT DOCUMENTS 493870    7/1992  European Pat. Off. ........ 257/668
4-280646  10/1992  Japan ............................. 257/668
5-226414  9/1993   Japan.

OTHER PUBLICATIONS

IBM TDB, vol. 37 No. 12 Dec. 1994, "Alignment method between tape carrier packaged driver IC and liquid crystal display glass panel", pp. 41–42.
IBM TDB, vol. 38 No. 06 Jun. 1995, "Slim and fine liquid crystal display driver packaging", pp. 461–462.

*Primary Examiner*—Mahshid D. Saadat
*Assistant Examiner*—T. M. Arroyo
*Attorney, Agent, or Firm*—Finnegan, Henderson, Farabow, Garrett & Dunner, L.L.P.

[57] ABSTRACT

The size reduction on a longer side of a semiconductor apparatus mounted on a TAB mounting package is accomplished by slits 105' that are in contact with left and right edge portions of a potting resin 102 and that are longer than sides in the vertical direction of a base film 104. In addition, the size reduction in the vertical direction is accomplished by a structure of which an edge portion in an output outer lead portion 107 extends to the inside of a mounting region 402 of an IC chip 303 (namely, a portion below the IC chip 303) and this portion is connected to the outside of the semiconductor apparatus.

12 Claims, 11 Drawing Sheets

TAPE MOUNTED SEMICONDUCTOR APPARATUS

BACKGROUND OF THE INVENTION

1. Field of the Invention

The present invention relates to a semiconductor apparatus, a fabrication method thereof, and an electronic apparatus thereof, in particular, relates to a semiconductor apparatus having an integrated circuit mounted corresponding to TAB (Tape Automated Bonding) mounting technology, a fabrication method thereof, and an electronic apparatus whose size is reduced therewith such as a liquid crystal display apparatus.

2. Description of the Related Art

Generally, when tape carrier package method (referred to as TAB mounting package) is used, the mounting area of a semiconductor apparatus can be reduced.

In a related art reference as disclosed in Japanese Patent Laid-Open Publication 5-226414, a wide tape carrier is used. Sprocket hole portions are formed in more inner positions than those of conventional apparatuses. Slits are formed between both sprocket hole portions. When the tape is cut out along the slits, thin and small mounting packages can be accomplished.

In this case, since a conventional holding carrier can be used, the fabrication process can be simplified.

When IC chips and LSI chips with a large number of pins at narrow pitches as with liquid crystal driver IC chips are connected to tape carrier packages, small packages can be accomplished.

Particularly, in a liquid crystal display apparatus, the tape carrier packages are preferably used as a mounting method for connecting liquid crystal driver IC chips with a large number of pins such as 200 pins or more for an output terminal portion. In addition, the tape carrier packages are used as a mounting method for connecting LSI chips with a large number of pins such as 200 to 300 pins or more as with gate arrays.

Moreover, along with the above-described advantages of the tape carrier packages, the degree of freedom of wiring patterns is high and the packages can be folded due to the flexibility of the base film.

A tape carrier package is formed in the following manner. A metal layer composed of for example Cu is deposited on a comb shaped base film composed of a synthetic resin with a higher heat resistance (this tape shaped base film is hereinafter referred to as a carrier film). Thereafter, the metal layer is patterned and thereby a wiring pattern is formed. For example, a liquid crystal driver IC chip with many pins is mounted on the carrier film. The liquid crystal driver IC chip is connected to an inner lead portion that protrude from a hole portion on the carrier film at a time. Thereafter, the liquid crystal driver IC chip is sealed with a synthetic resin such as epoxy resin.

Sprocket hole portions are formed on the carrier film. The sprocket hole portions are used to convey the carrier film in the package assembling process. In addition, an inspection pad or the like is formed on the carrier film. When the tape carrier package is mounted on a wiring board or a printed circuit board of a liquid crystal display apparatus, the tape carrier package is punched out from the carrier film and formed as an independent mounting package.

FIGS. 11A and 11B are plan views showing the conventional tape shaped carrier package. FIG. 12 is a sectional view of FIGS. 11A and 11B. FIG. 11A is a plan view on a-side of FIG. 12. FIG. 11B is a plan view on b-side of FIG. 12.

Referring to FIG. 11, a conductor layer composed of Cu or like is formed on a carrier film 1001 composed of a synthetic resin with a high heat resistance such as a polyimide film. Thereafter, the conductor layer is etched out and thereby a conductor pattern 1002 is formed.

A device hole portion 1003 is formed at a mounting portion of the IC chip 1004 on the carrier film 1001. The size of the device hole portion 1003 is slightly larger than the size of an IC chip 1004.

An inner lead portion 1005 that is an electrode portion connected to input/output terminal portions of the IC chip 1004 extrudes in the device hole portion 1003.

As shown in FIG. 12, an extruded bump portion 1006a composed of Au or the like is formed on a connection pad portion of the IC chip 1004. The bump portion 1006a on the IC chip 1004 side and the inner lead portion 1005 are connected by heat fitting method.

An outer lead portion 1007 is an electrode portion connected to the outside of the apparatus. The outer lead portion 1007 is formed as a pattern that extends from the bump portion 1006b on the IC chip 1004 to an outer peripheral portion (namely, an outer line along which the package is punched out by a die) of the TAB mounting package outside a potting resin 1008. The portion on which the IC chip 1004 is mounted is sealed with the potting resin 1008 composed of epoxy resin or the like so as to protect the IC chip 1004, the inner lead portion 1005, the bump portions 1006a and 1006b, and so forth.

Thereafter, as shown in FIG. 13, a connection terminal portion 1011 of the TAB mounting package 1010 is connected to a connection terminal portion (not shown) on a liquid crystal display panel 1009 side. Generally, to connect these connection terminal portions, an anisotropic conductive bonding agent 1012 is applied thereon and heated and pressured.

As shown in FIG. 14, a connection electrode portion 1013 at an edge portion of the outer lead portion 1007 of the TAB mounting package 1010 is connected to a drive circuit board 1014. They are connected with a printable solder 1015 such as a paste cream type solder by for example reflow method. The drive circuit board 1014 is disposed at an outer peripheral portion of the liquid crystal display panel 1009. Wiring and circuits that supply a power voltage, synchronous pulses, and so forth to a plurality of TAB mounting packages 1014 are formed on the drive circuit board 1014.

In recent years, attempts for reducing the size of an outer portion (frame portion) of the display region of the liquid crystal display panel 1009 have been made. As shown in FIGS. 13 and 14, a structure of which a longer side of the TAB mounting package 1010 on which the IC chip 1004 is disposed in parallel with a side of the peripheral portion of the screen display region of the liquid crystal display panel is conventionally employed. Thus, slim type IC chips with a narrow width (for example, approximately 1 mm thick) and a long length have been widely used for liquid crystal drive IC chips and so forth.

However, according to the conventional technologies, the TAB mounting package 1010 and the liquid crystal display panel 1009 are connected with the connection electrode portion 1013 at the edge of the outer lead portion 1007. Thus, a large area for the potting resin 1008, the outer lead portion 1007, and so forth is required. In addition, an area for the connection electrode portion 1013 is required. Thus, even if a very narrow slim type IC chip is used as the IC chip 1004, the size of the area from the peripheral portion of the liquid crystal display panel 1006 to the outer region (frame portion) cannot be reduced.

As described above, in the conventional structure, the area of the frame portion at the periphery of the screen of the liquid crystal display panel cannot be reduced.

In addition to the problem of which the width of the TAB mounting package 1010 cannot be reduced, the length of the longer side of the TAB mounting package 1010 should be reduced.

In other words, the requirement of the size reduction of liquid crystal display apparatuses is becoming strong. Thus, the tape carrier packages should be also reduced.

However, according to the conventional tape carrier package technologies, it is difficult to reduce the size of the longer side of the packages.

As described above, a required portion is punched out from the carrier film 1001 along an outer line 1016 by a die and thereby individual TAB mounting packages 1010 are obtained. When the required portion is punched out, if the die contacts the potting resin 1008, it will crack and thereby the mounting package will become defective. This is because moisture and oxygen in air, dust, and the like enter the TAB mounting package from the crack portion. Thus, the IC chip 1004 that should be sealed with the sealing resin is exposed to the moisture and oxygen and thereby the operation failure thereof will take place.

To prevent the potting resin 1008 from cracking, the fluctuation of positions of the sealing resin of the IC chip 1004, the fluctuation of punch-out positions, the margin of the blade of the die, and so forth are considered. The area of the punch-out region of the mounting packages that is satisfactorily larger than the minimum required area is designed.

When the width of the blade of the die is for example 0.5 mm, a tolerance of at least 1 mm is required on both sides of the cut line depending on the punch-out accuracy of the blade and the finish accuracy of each member of the package. When the size reduction of a mounting package is further required, even if the tolerance for four sides of the base film is as small as 1 mm, the increase of the area becomes a critical problem.

In addition, a region for physically holding the carrier film 1001 in the punch-out process is required. Thus, the TAB mounting packages should be designed in consideration of this region.

Thus, as shown in FIG. 11, the outer line 1016 for the punch-out by the die (referred to as the cut line) is defined. Consequently, the base film punched out along the outer line 1016, the IC chip 1004 mounted thereon, and the potting resin 1008 are left as one independent mounting package. Thus, the area of the base film in the outer line 1016 substantially determines the outer size of the tape carrier package. Consequently, the resultant area of the TAB mounting package 1010 becomes much larger than the required area, thereby preventing the size reduction of the TAB mounting package 1010.

As described above, the size in the vertical direction (longer side) and the size in the horizontal direction (shorter direction) of the mounting packages of the conventional tape carrier package type cannot be reduced. Thus, it is difficult to reduce the size of an electronic apparatus such as a liquid crystal display apparatus having a semiconductor apparatus using the above-described mounting package.

The present invention is made to solve such problems. An object of the present invention is to provide a semiconductor apparatus that mounts a liquid crystal driver IC chip for use with a liquid crystal display apparatus, an LSI chip such as a gate array with a large number of input/output terminal pins, or the like with a very small area. Another object of the present invention is to provide an electronic apparatus such as a liquid crystal display apparatus having a semiconductor apparatus with a reduced size so as to reduce the entire size of the electronic apparatus.

SUMMARY OF THE INVENTION

A semiconductor apparatus comprises an IC chip mounted on a main surface of a base film, a conductive lead pattern formed as a pattern that extends from the IC chip to a first side of the base film, and a sealing member for covering and sealing the main surface including a portion of the IC chip connected to at least the lead pattern, wherein an outer line of the base film is formed so that a second side that is perpendicular to the first side is substantially in contact with a contour line of a region sealed with the sealing member.

The semiconductor apparatuses are cut out as individual mounting packages from the tape carrier. Each mounting package is connected to a circuit substrate having an electronic device. Thus, an electronic apparatus according to the present invention is formed.

In other words, when a rectangular IC chip is mounted on a mounting package by TAB method, an edge portion of the lead pattern is disposed as a connection terminal portion on a longer side of the IC chip. In this case, the size of the longer side of the base film can be reduced to the size that is substantially the same as the size of the sealing member. Thus, the outer size of the mounting package can be further reduced.

The phrase "is substantially in contact with" means that "is in contact with . . . in the range of the forming error such as surface tension of the sealing member (potting resin)". This is because the sealing member is generally composed of a synthetic resin material such as epoxy resin. Thus, when a viscous synthetic resin material is potted and hardened on the IC chip, the edge portion of the sealing member may slightly deviate from the edge portion of the base film due to the surface tension. However, this deviation is very small and can be omitted from the spirit of the present invention. To include this kind of meaning, the word "substantially" is used. This applies to the entire specification including claims and embodiments of the present invention.

The slits include portions that are in contact with the contour line of a region sealed with the sealing member, and the length of each slit is longer than one side of the IC chip. And when, at the longer portion of the slit, width of the slit is made wider than that at the portion in contact with the region sealed with the sealing member, and especially slits at portions corresponding to edge portions of a potting resin inwardly extend along corners of the potting resin, the base film can be cut out corresponding to the slits without need to use a die.

Thus, since it is not necessary to consider the cutting margin for the die, the size of the package can be reduced for the area.

In the semiconductor apparatus, the lead pattern does not substantially have the exposed portion at an outer portion of the mounting region.

In other words, the exposed portion of the lead pattern that is connected to the outside of the semiconductor apparatus is disposed inside the mounting region of the IC chip so that the exposed portion of the lead pattern is almost overlaid on the IC chip. Thus, the area of this portion of the mounting package can be remarkably reduced. In other words, the width of the mounting package on the shorter side perpendicular to the longer side of the IC chip can be remarkably reduced. Experimental results conducted by the inventors of the present invention show that the area of the package is reduced by 30%.

Moreover, the electronic apparatus according to the present invention uses the above-described semiconductor apparatus, thereby reducing the size of the entire electronic apparatus.

A third aspect of the present invention is a semiconductor apparatus corresponding to both the first and second aspects of the present invention. In other words, the outer size of the mounting package of the semiconductor apparatus is reduced on both the longer (longitudinal) side and shorter (lateral) side of the IC chip.

These and other objects, features and advantages of the present invention will become more apparent in light of the following detailed description of best mode embodiments thereof, as illustrated in the accompanying drawings.

DESCRIPTION OF THE PREFERRED EMBODIMENTS

Next, with reference to the accompanying drawings, a semiconductor apparatus, a fabrication method thereof, and a liquid crystal display apparatus that is an electronic apparatus using the semiconductor apparatus according to embodiments of the present invention will be described.

(FIRST EMBODIMENT)

Figure 1A:
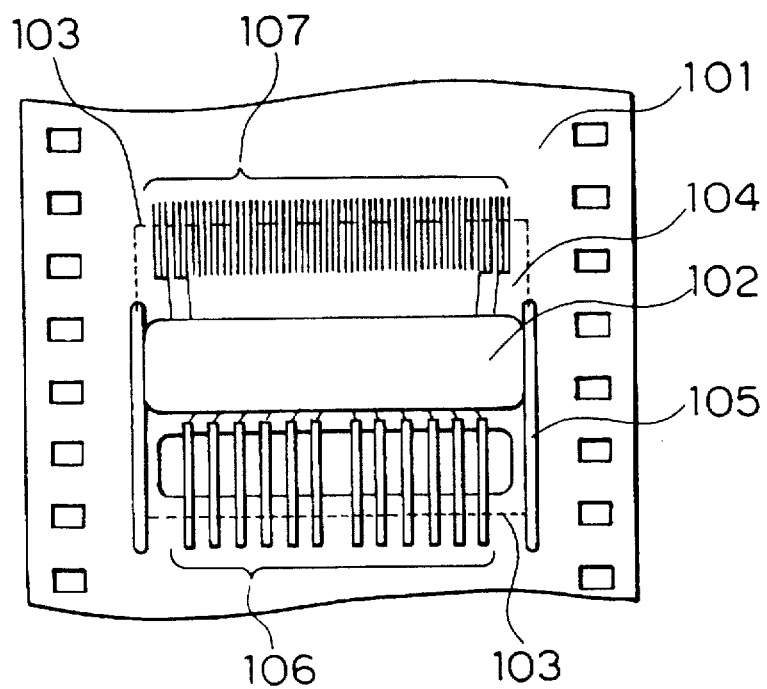
FIGS. 1A and 1B are plan views showing an outline of the structure of a semiconductor apparatus according to a first embodiment of the present invention.

FIG. 1A is a plan view showing an outline of the structure of a semiconductor apparatus according to a first embodiment of the present invention. An LSI chip with a size of 2 mm×10 mm is mounted on a carrier tape 101. The LSI chip is sealed with a potting resin 102 composed of a black sealing epoxy resin. The maximum size of the sealing region is 6 mm×14 mm.

The LSI chip is mounted at the mounting region of the carrier tape 101 and then LSI chip is sealed with the potting resin 102. Thereafter, the carrier tape 101 is punched out along a cut line 103 by a die (the die is not shown). Thus, the base film 104 that is punched out along the cut line 103 is formed as a TAB mounting package.

Before the punch-out step, slits 105 are formed in the directions in parallel with the shorter sides of the LSI chip (in the vertical direction of the drawing) and at both left and right edges of the resin sealing region. The size of the slits 105 is 0.6 mm×10 mm.

Since the cut lines 103 in contact with the left and right sides on shorter sides (in the vertical direction of the drawing) of the sealing region sealed with the potting resin 102 have been cut out by the slits 105 on the carrier tape 101, so, it is not necessary to punch out there.

In addition, on the left and right shorter sides (in the vertical direction of the drawing) of the potting resin 102, the sealing resin is prevented from extending due to the slits 105 formed on the carrier tape 101. Thus, the mounting package with a necessary and sufficient size is formed. Consequently, neither the extra area for the punch-out margin corresponding to the blade of the die nor the holding portion of the base film 104 is required.

As a result, according to the mounting package method of the semiconductor apparatus of the present invention, the size of the mounting package can be reduced for at least the extra area.

Figure 1B:
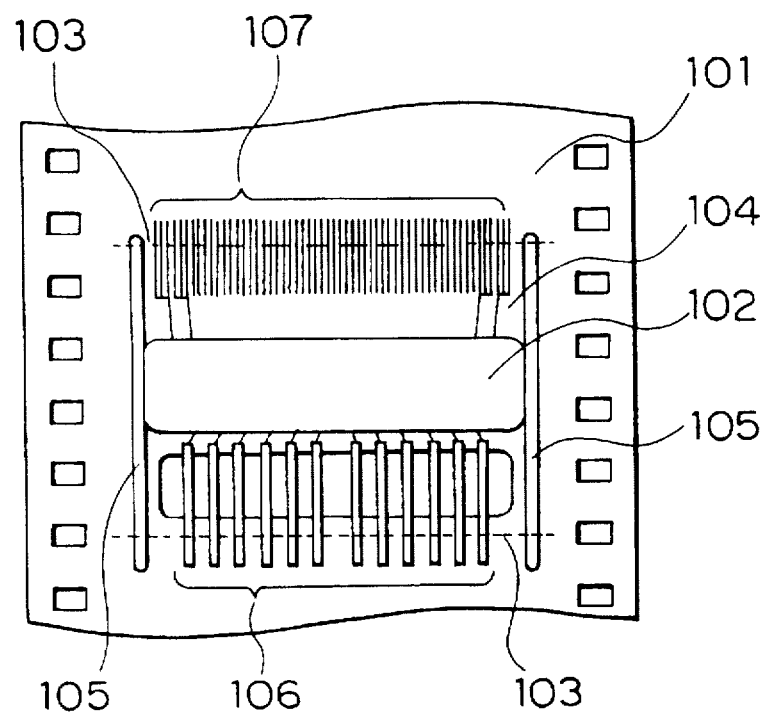

As shown in FIG. 1B, the slits 105 that extend to an output region of the carrier tape 101 may be formed. In this case, only two longer sides at which an outer lead portion 106 on the input side of the TAB mounting package and at which an outer lead portion 107 on the output side of the TAB mounting package (namely, the upper and lower sides of the base film 104 in FIG. 1B) can be punched out.

When such slits 105 are formed, it is not necessary to punch out the two sides at which the input and output terminal portions of the TAB mounting package are not formed. Thus, since the punch-out margins of the die and the holding region for the base film 104 are omitted, the outer size of the base film 104 can be more reduced than the case that there are portions to be partially punched out as shown in FIG. 1A.

(SECOND EMBODIMENT)

Figure 2:
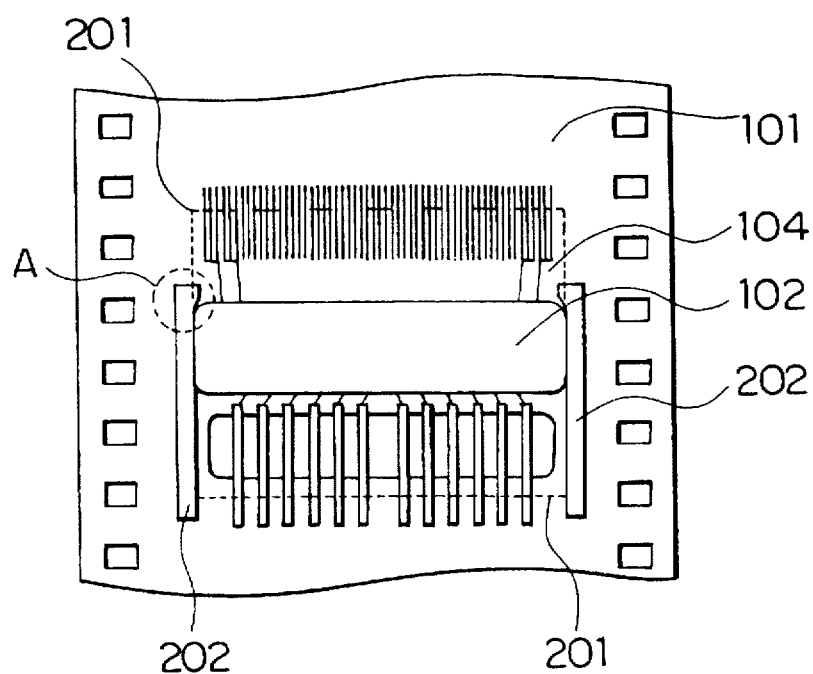
FIG. 2 is a plan view showing an outline of the structure of a semiconductor apparatus according to a second embodiment of the present invention.

FIG. 2 is a plan view showing an outline of the structure of a semiconductor apparatus according to a second embodiment of the present invention. For simplicity, in FIG. 2, similar portions to those according to the first embodiment shown in FIG. 1 are denoted by similar reference numerals.

In the first embodiment, the slits 105 are formed straightly (in the vertical direction of FIG. 1). In the second embodiment, slits 105 at portions denoted by letter A in FIG. 2 corresponding to edge portions of a potting resin 102 inwardly extend along corners of the potting resin 102 by 0.7 mm.

When the carrier tape 101 is punched out in a required shape, in case a cut line 201 matches extended lines of the narrower widths of 0.6 mm of slits 202a and 202b, the outer size in the vertical direction of the tape carrier package matches the outer contour line of the sealing region 23. Thus, the outer size of the mounting package can be further reduced.

(THIRD EMBODIMENT)

Figure 3:
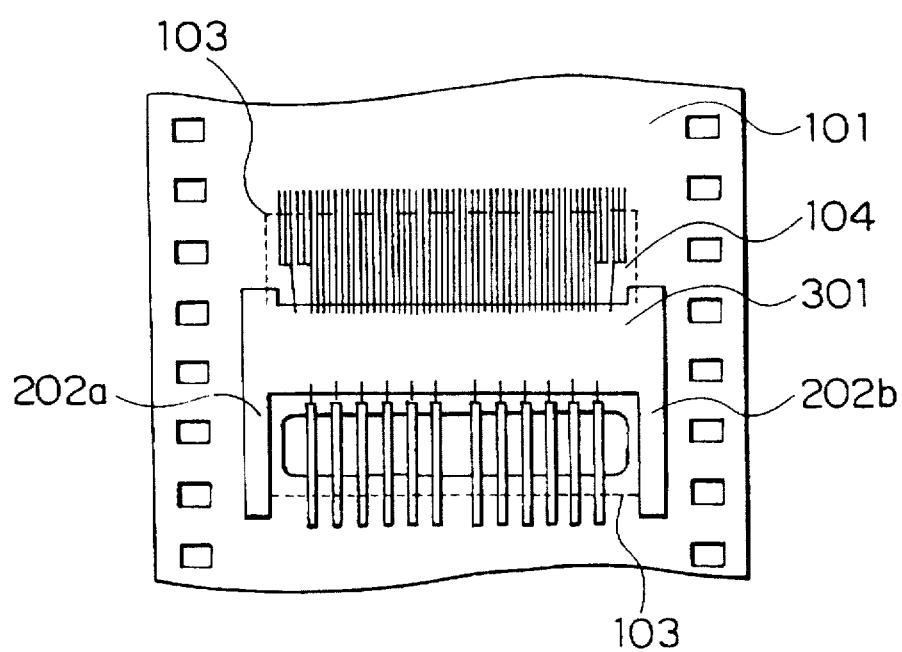
FIG. 3 is a plan view showing an outline of the structure of a tape carrier (on which an IC chip is not mounted) of a semiconductor apparatus according to a third embodiment of the present invention.
Figure 4A:
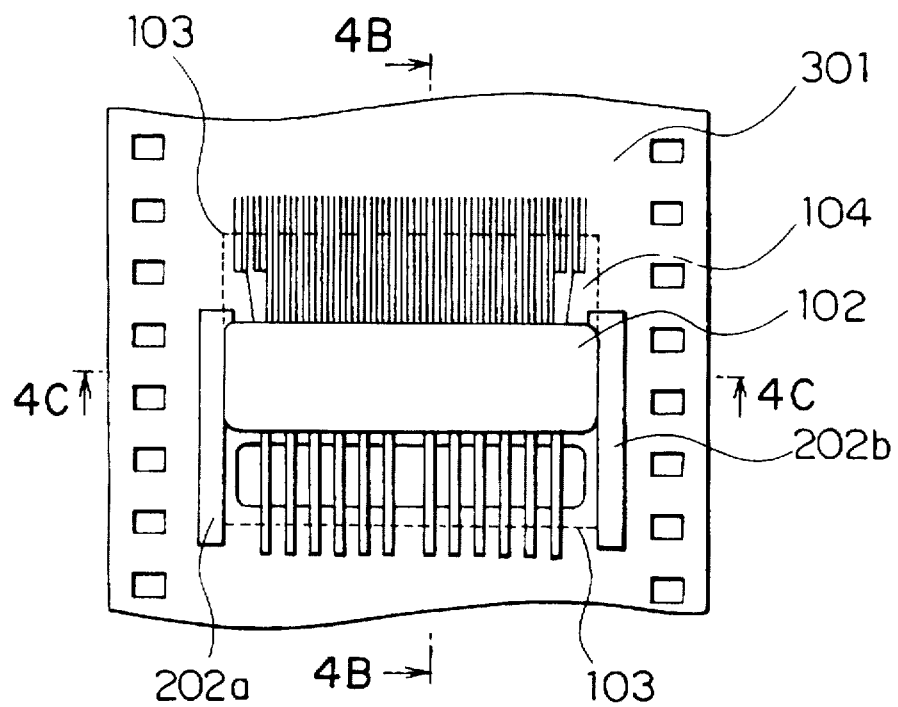
FIG. 4A is a plan view showing a structure of which an IC chip 303 is mounted on a tape carrier 302 and sealed with a potting resin 102.

FIG. 3 is a plan view showing an outline of the structure of a tape carrier (on which an IC chip is not mounted) of a semiconductor apparatus according to a third embodiment of the present invention. FIG. 4A is a plan view showing the structure of which an IC chip 303 is mounted on a tape carrier 302 and sealed with a potting resin 102.

Figure 4B:
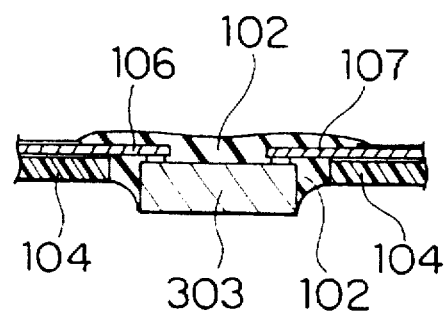
FIGS. 4B and 4C are sectional views of FIG. 4A.
Figure 4C:
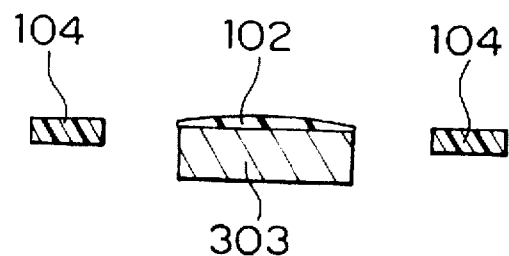

FIG. 4B is a sectional view taken along line 4B-4B' of FIG. 4A. FIG. 4C is a sectional view taken along line 4C-4C' of FIG. 4A. For simplicity, in FIGS. 3 and 4, similar portion to those according to the first and second embodiments shown in FIGS. 1 and 2 are denoted by similar reference numerals.

In the first and second embodiments, the left and right slits are formed and the potting resin is formed between the slits. Thus, the left and right slits are not connected. In the third embodiment, the two left and right slits 202a and 202b of the second embodiment are connected through a device hole 301.

The outer size of an LSI chip 303 mounted on a tape carrier 302 is 2 mm×10 mm. Corresponding to the outer size of the LSI chip 303, the size of the device hole 301 is defined. The length from the device hole 301 to one longer side (in the horizontal direction of FIG. 3) of the LSI chip 303 is approximately 0.3 mm. Thus, the width in the vertical direction of the device hole 301 is approximately 2.6 mm.

By such a method, as with the case of the second embodiment, the outer size of the mounting package can be further reduced.

(FOURTH EMBODIMENT)

Figure 5A:
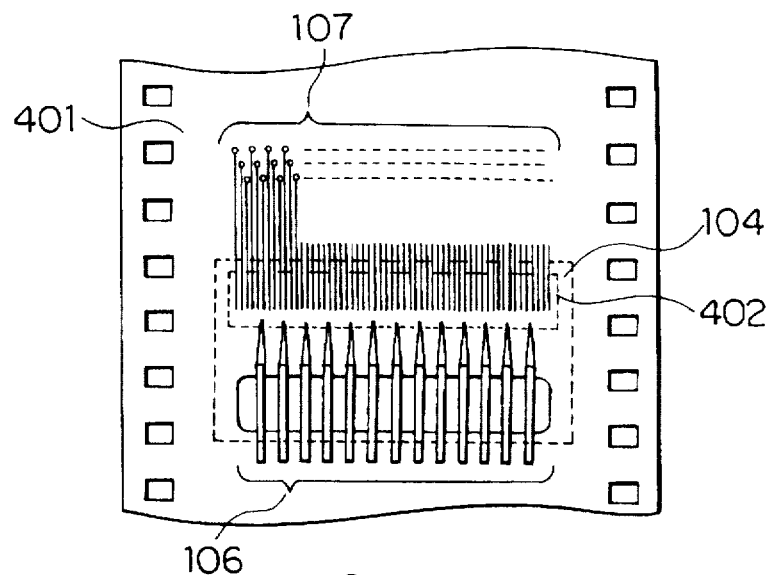
FIGS. 5A and 5B are plan views showing an outline of the structure of a semiconductor apparatus according to a fourth embodiment of the present invention.
Figure 5B:
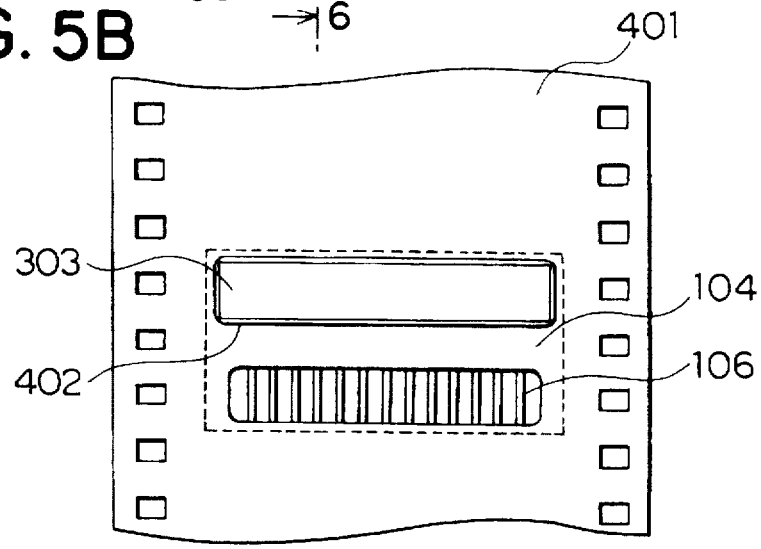
Figure 6:
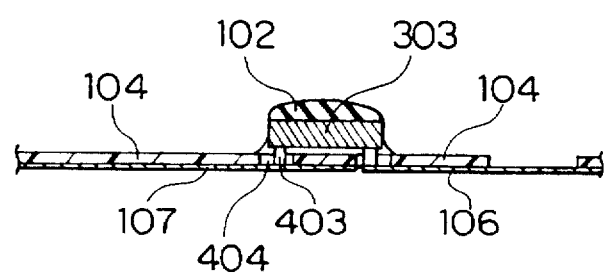
FIG. 6 is a sectional view showing an outline of the structure of a semiconductor apparatus according to a fourth embodiment of the present invention.

FIG. 5A is a plan view showing an outline of the structure of an IC chip mounted side of a semiconductor apparatus according to a fourth embodiment of the present invention. FIG. 5B is a plan view showing an outline of the structure of the reverse side of FIG. 5A. FIG. 6 is a sectional view of FIGS. 5A and 5B. For simplicity, in FIGS. 5 and 6, similar portions to those according to the first to third embodiments shown in FIG. 1 to 4 are denoted by similar reference numerals.

An opening portion 404 is formed on a carrier film 401 composed of polyimide corresponding to a connection bump portion 403 of an IC chip 303 mounted on a predetermined mounting region 402. The opening portion 404 can be formed on a predetermined portion of the carrier film 401 by photoetching process or laser process.

An input outer lead portion 106 and an output outer lead portion 107 are formed on a rear main surface of a main surface on which the IC chip 303 of the carrier film 401 is mounted.

An edge portion of the output outer lead portion 107 on the IC chip 303 side extends to an inner portion of the mounting region 402. The pattern of the outer lead portion 107 that extends to the inner portion of the mounting region 402 is exposed to the outside of the package, not sealed with the sealing resin, solder resist layer, and so forth. The pattern is connected to the outside of the package.

The outer lead portion 107 and the outer lead portion 106 are patterned by photoetching process.

A sealing resin is formed between the carrier film 401 and the IC chip 303 and on the rear main surface of the main surface on which the bump portion 403 of the IC chip 303 is formed by the potting process as a potting resin 102.

The potting resin 102 protects the exposed portion of the IC chip 303 and the connecting portions in the vicinity of the bump portion 403.

The mounting package of the semiconductor apparatus according to the present invention can be fabricated in the following manner.

A polyimide film with a thickness of 25 μm is prepared so as to form a carrier film 401. A Cu film with a thickness of approximately 0.2 μm is deposited on one surface of the polyimide film by evaporation method so as to form a conductor layer.

Thereafter, a resist is coated on the conductor layer. The resist is exposed and developed and thereby a resist pattern corresponding to the outer lead portion 107 and the outer lead portion 106 is formed. A Cu layer is deposited on the non-resist portion by electroplating method. In this embodiment, the thickness of the Cu layer is 18 μm.

Thereafter, the opening portion 404 corresponding to the bump portion 403 of the IC chip 303 is formed. The opening portion 404 forms a pattern corresponding to the bump portion 403 with a resist just below the outer lead portion 107. With the resist, the polyimide film is etched out and the polyimide film corresponding to the bump portion 403 is removed. Thus, the opening portion 404 is formed.

After the resist is peeled off, the entire polyimide film on which the Cu layer is formed is soaked in an etching solution and thereby the deposited Cu is removed. Thus, a tape carrier is formed.

If necessary, one of a variety of predetermined metals may be plated on the surface of the Cu layer and then a solder resist may be coated on the resultant structure.

An IC chip 303 is mounted at a mounting region 402 of the carrier film 401. In this embodiment, a bump portion 40 of the IC chip 303 is composed of solder with a thickness of 40 μm. The bump portion 40 is connected to the tape carrier by solder.

A sealing resin is formed between the carrier film 401 and the IC chip 303 and on the rear main surface of the main surface on which the bump portion 403 of the IC chip 303 is formed by the potting process as a potting resin 102. The potting resin 102 protects the exposed portion of the IC chip 303 and the connecting portions in the vicinity of the bump portion 403.

As another mounting method of the IC chip 303, one of various method using for example anisotropic conductive bonding agent such as ACF, and conductor bonding agent such as Ag may be employed.

Or as still another mounting method may be used a method utilizing a eutectic bonding generated by plating the wirings of the circuit substrate with Sn or solder, the wirings which are made of Cu or the like, and using Au as a bump electrode.

And, potting resin 102 is not necessarily put on the main surface of the IC chip 303. It may only be provided for protecting the bump portion 403.

(FIFTH EMBODIMENT)

Figure 7A:
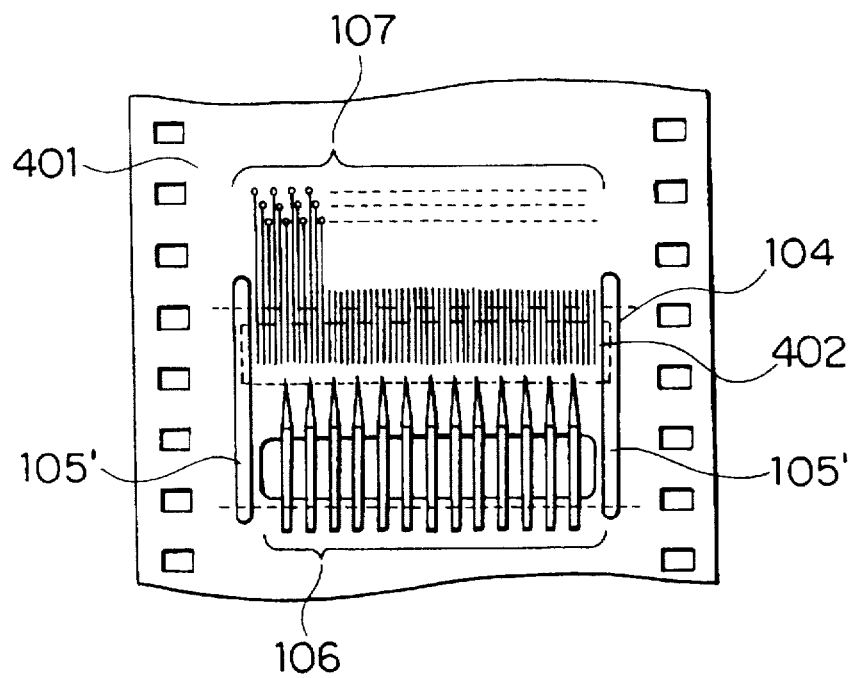
FIGS. 7A and 7B are plan views showing an outline of the structure of a semiconductor apparatus according to a fifth embodiment of the present invention.
Figure 7B:
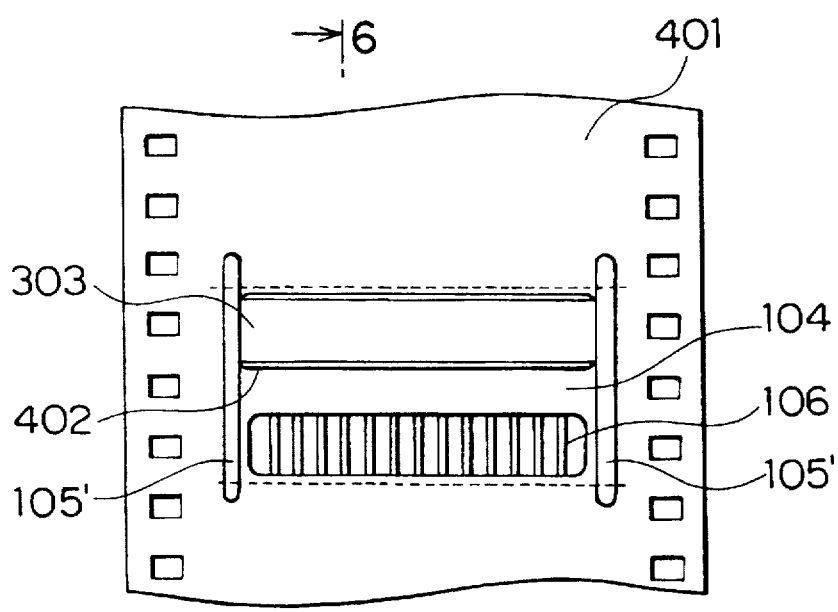

FIGS. 7A and 7B are plan views showing an outline of the structure of a semiconductor apparatus according to a fifth embodiment of the present invention. For simplicity, in FIG. 7, similar portions to those according to the first to fourth embodiments shown in FIGS. 1 to 6 are denoted by similar reference numerals.

In the fifth embodiment, both the size in the vertical direction and the size in the horizontal direction of the TAB mounting package are reduced. In other words, both the size in the vertical direction and the size in the horizontal direction of the base film 104 that substantially affects the outer size of the TAB mounting package are reduced. The technology for reducing the size in the horizontal direction according to the first to third embodiment and the technology for reducing the size in the vertical direction according to the fourth embodiment are applied for a mounting package of a semiconductor apparatus. This is a semiconductor apparatus according to a best mode embodiment of the present invention.

In other words, the size reduction in the horizontal direction shown in FIG. 7 is accomplished by slits 105' that are longer than the sides in the vertical direction of the base film 104 as with the case of the first embodiment. The size reduction in the vertical direction shown in FIG. 7 is accomplished by a structure of which the edge portion inside the output outer lead portion 107 extends to an inner portion of the mounting region 402 of the IC chip 303 (namely, to a lower portion of the IC chip 303). This portion is connected to the outside of the package.

With such a structure, both the size in the vertical direction and the size in the horizontal direction can be reduced. Thus, the size reduction of a mounting package for use with a semiconductor apparatus is much larger than those of the conventional methods.

(SIXTH EMBODIMENT)

In a sixth embodiment, a semiconductor apparatus according to the present invention is mounted on a liquid crystal display apparatus and thereby a liquid crystal display apparatus is formed as a small electronic apparatus.

Figure 8:
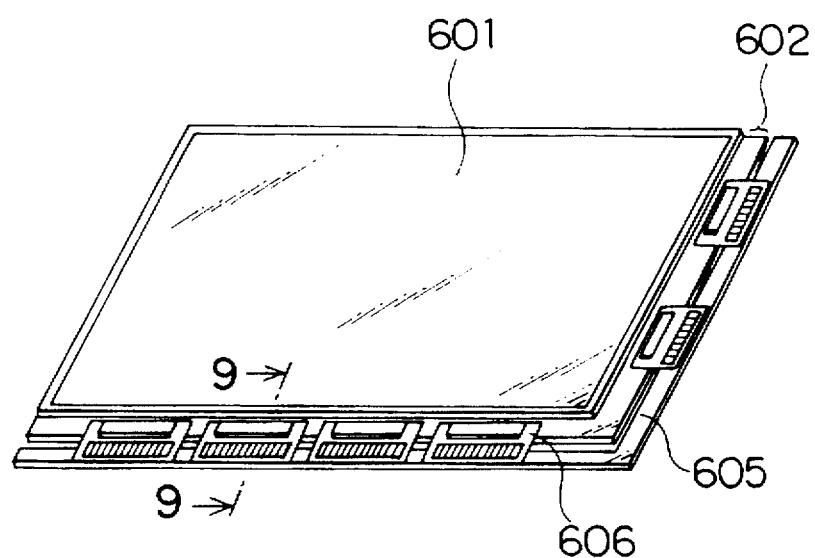
FIG. 8 is a perspective view showing a liquid crystal display apparatus as an electronic apparatus according to the present invention.
Figure 9:
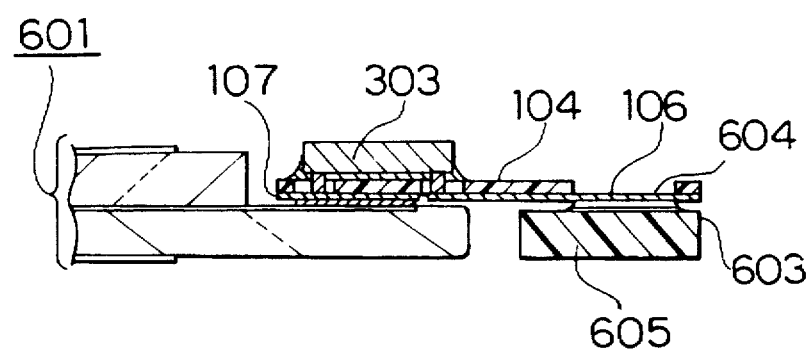
FIG. 9 is a sectional view for explaining in particular a mounting method of a semiconductor apparatus for use with a liquid crystal display apparatus according to the present invention.

FIG. 8 is a perspective view showing an outline of the structure of a liquid crystal display apparatus as an electronic apparatus according to the present invention. FIG. 9 is a sectional view for explaining in particular a mounting method of the semiconductor apparatus for use with the liquid crystal display apparatus.

In FIGS. 8 and 9, a liquid crystal display panel 601 is the same as a conventional liquid crystal display panel. At a peripheral portion 602 of a lower substrate of the liquid crystal display panel 601, a comb shaped connection electrode terminal portion 603 composed of a metal film such as an Al film is formed. An exposed portion connected to the outer lead portion 107 of the semiconductor apparatus according to the fifth embodiment is aligned with the connection electrode terminal portion 603. Thereafter, the connection electrode terminal portion 603 and the outer lead portion 107 are electrically and physically connected with an ACF (that is an anisotropic conductive bonding agent) 604.

In this embodiment, as with the case of each of the above-described embodiments, since the input outer lead portion 106 of the mounting package 606 protrudes from the peripheral portion of the IC chip 303, the input outer lead portion 106 protrudes from the liquid crystal display panel 601. This portion is connected to a drive circuit board 605.

Figure 10A:
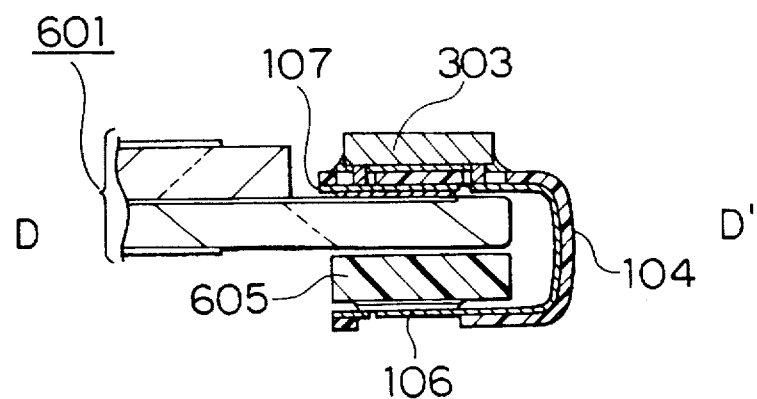
FIGS. 10A and 10B are sectional views showing an outer lead portion 106 that is folded toward a rear side of a display side of a liquid crystal display panel 601 along with a drive circuit board 605 connected to the outer lead 106 portion.
Figure 10B:
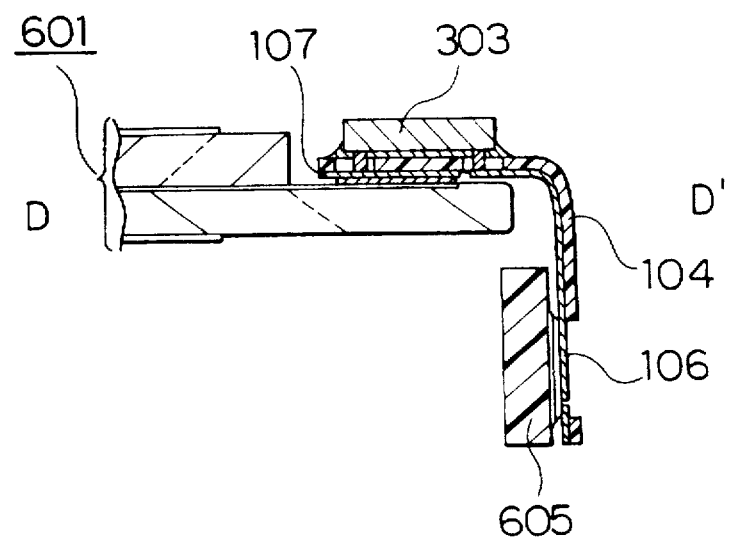
Figure 11A:
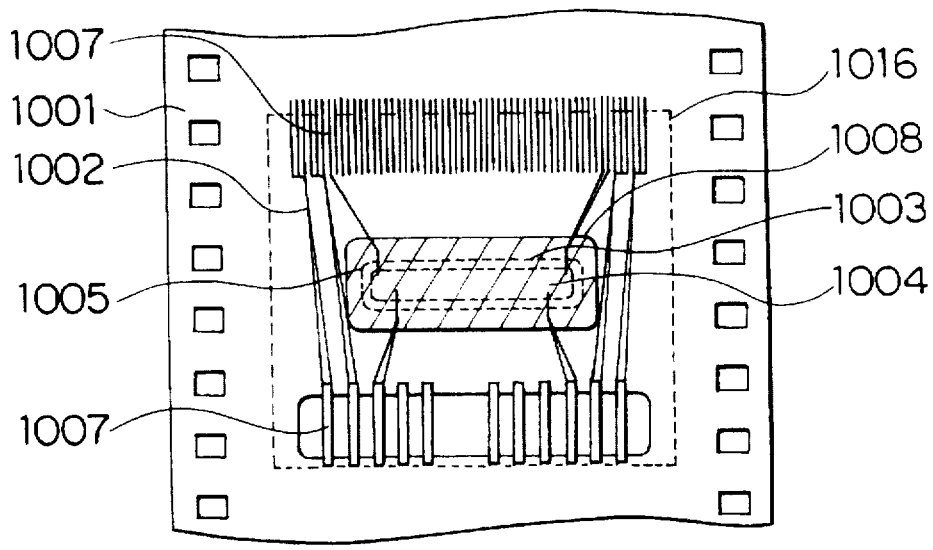
FIGS. 11A and 11B are plan views showing a semiconductor apparatus mounted on a conventional TAB mounting package.
Figure 11B:
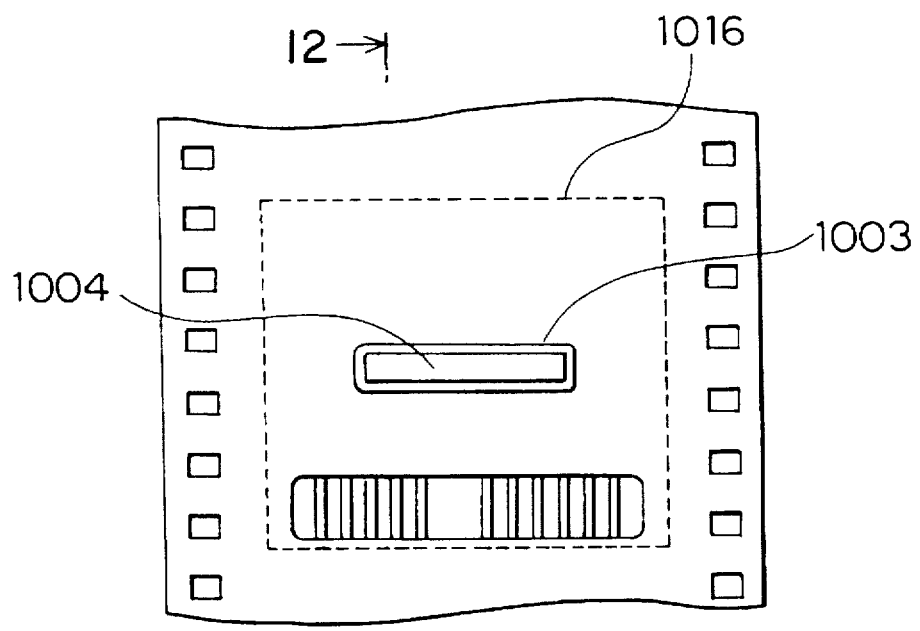
Figure 12:
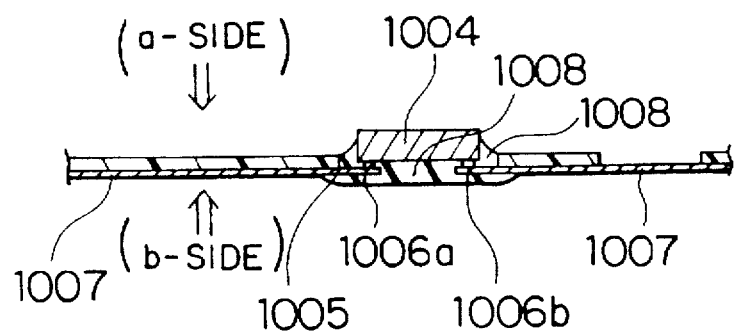
FIG. 12 is a sectional view showing a semiconductor apparatus mounted on a conventional TAB mounting package.
Figure 13:
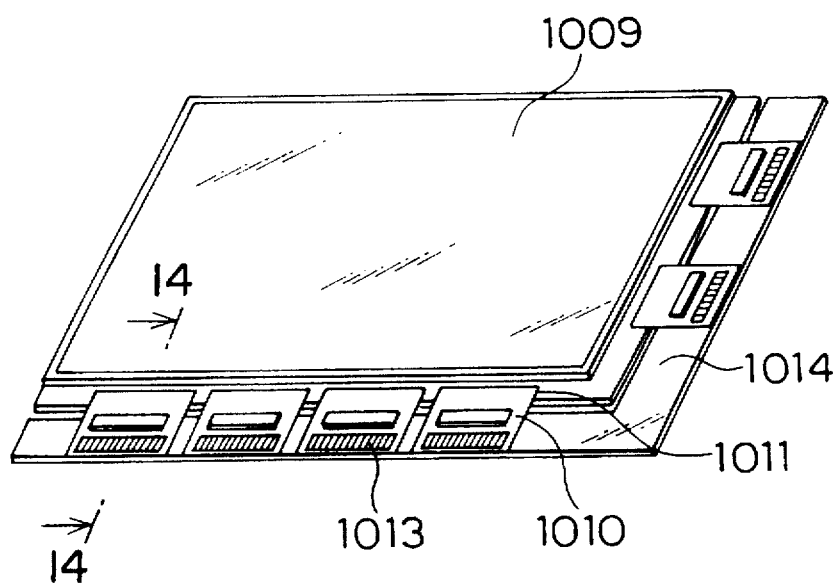
FIG. 13 is a perspective view showing a liquid crystal display apparatus using a semiconductor apparatus mounted on a conventional TAB mounting package.
Figure 14:
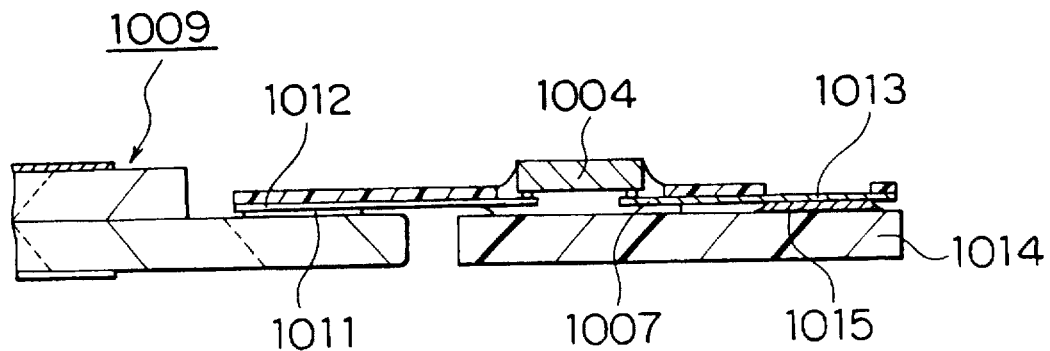
FIG. 14 is a sectional view showing a mounting portion of a semiconductor apparatus of a liquid crystal display apparatus using a semiconductor apparatus mounted on a conventional TAB mounting package.

Since the outer lead portion 106 that protrudes from the liquid crystal display panel 601 and extends to the drive circuit board 605 is composed of a metal, it can be folded. As shown in FIG. 10, the outer lead portion 106 is folded toward the rear surface of the display side of the liquid crystal display panel 601 along with the drive circuit board 605 connected to the outer lead portion 106. Thus, the area of the frame portion outside the display region of the display screen of the liquid crystal display panel 601 can be substantially removed. In other words, since the outer lead portion 106 is folded on the rear surface of the liquid crystal display panel 601, the area of the outer lead portion 106 is removed as the thickness of the rear surface of the liquid crystal display panel 60 or the thickness of a back light (not shown) disposed thereon.

Figure 15:
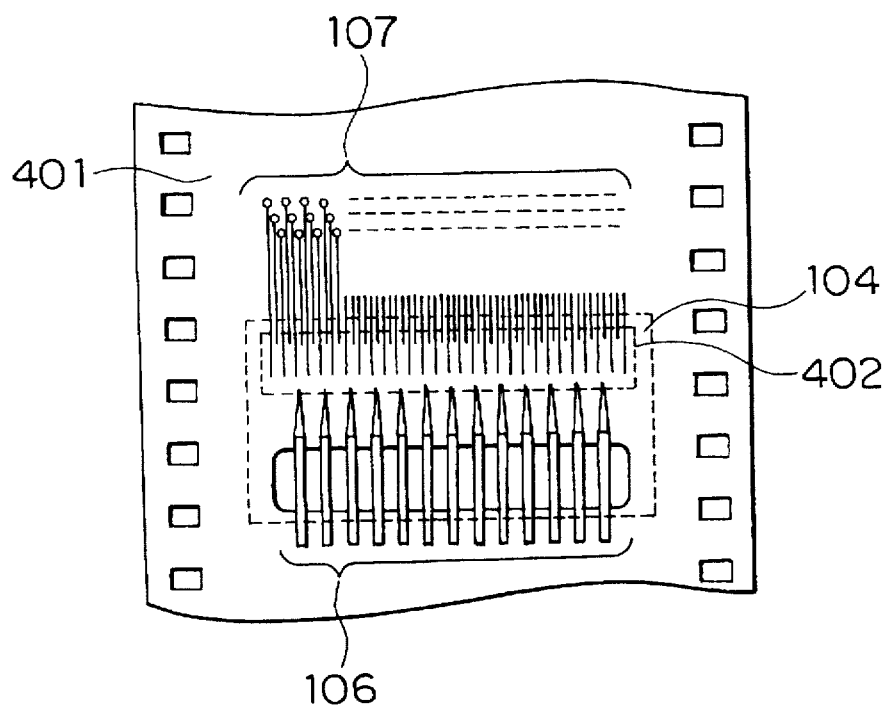
FIG. 15 is a plan view showing an IC chip with the present invention applied thereto, IC chip which has a pattern that leads extend from the two longer sides thereof.
Figure 16:
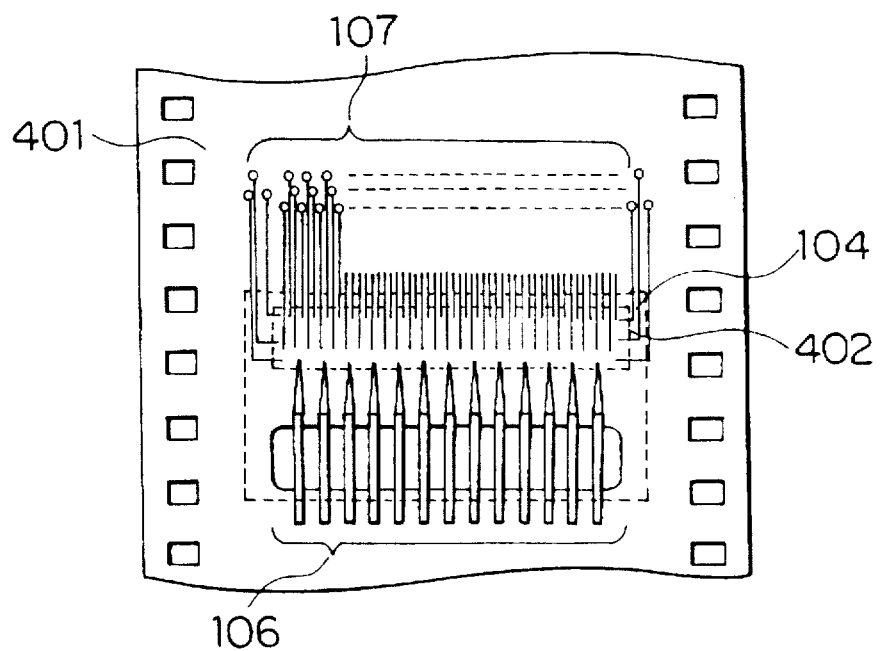
FIG. 16 is a plan view showing an IC chip with the present invention applied thereto, IC chip which has a pattern that leads extend in a zigzag from the shorter sides of the IC chip as well as from the longer sides.

As shown in FIG. 15, in at least either the outer lead portion 106 or 107, leads may extend from each of the two longer sides of the IC chip facing and in parallel with each other to from a pattern of a zigzag arrangement, for example, in FIG. 15. As shown in FIG. 16, leads extend from the longitudinal sides of the IC chip 303 as well to keep the density of conjunction bumps arranged on one side of the IC chip low, thereby simplifying the conjunction.

As described above, according to the present invention, an LSI chip such as a gate array with a large number of input/output terminal pins, or the like can be mounted with a very small area. In addition, an electronic apparatus such as a liquid crystal display apparatus having a semiconductor apparatus with a reduced size can be used so as to reduce the entire size of the electronic apparatus.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. A semiconductor apparatus, comprising:
   an IC chip mounted on a main surface of a base film;
   a conductive lead pattern formed on the base film and electrically connected with the IC chip, said conductive lead pattern extending from the IC chip toward an edge of the base film; and
   a sealing member formed as a predetermined pattern for covering the main surface and the IC chip,
   wherein the edge of the base film along the extending direction of the lead pattern is in contact with an edge of the sealing member pattern.

2. A semiconductor apparatus, comprising:
   an IC chip mounted on a main surface of a base film;
   a conductive lead pattern formed on the base film and electrically connected with the IC chip, said conductive lead pattern extending from the IC chip toward an edge of the base film; and a sealing member formed as a predetermined pattern for covering the main surface and the IC chip, wherein slits are formed in the base film at both sides of the IC chip along the extending direction of the lead pattern and are in contact with an edge of the sealing member pattern.

3. The semiconductor apparatus as set forth in claim 2, wherein the slits are longer than the length of said IC chip, and the slits have wide portions that extend toward said IC chip.

4. The semiconductor apparatus as set forth in claim 2, wherein a device hole for said IC chip is formed on the base film, and the device hole is integrally connected to said slits.

5. An electronic apparatus, comprising:

a semiconductor apparatus having an IC chip mounted on a main surface of a base film, a conductive lead pattern formed on the base film and electrically connected with the IC chip, said conductive lead pattern extends from the IC chip toward as an edge of the base film, and a sealing member formed as a predetermined pattern for covering the main surface and the IC chip; and a circuit board having an electronic device connected to said semiconductor apparatus, wherein an edge of the base film along the extending direction of the lead pattern is in contact with the edge of the sealing member pattern.

6. A semiconductor apparatus, comprising:

an IC chip mounted on a main surface of a base film at a mounting region; and a plurality of first conductive leads disposed at an edge of the mounting region and connected to the IC chip and a plurality of second conductive leads disposed at another edge of the mounting region and connected to said IC chip.

wherein at least a part of the plurality of said first conductive leads extends from where connected with the IC chip toward an inner portion of the mounting region; and further including a sealing member for the main surface and the IC chip, wherein an edge of the base film along the extending direction of the part of the plurality of said first conductor leads is in contact with an edge of the sealing member pattern.

7. The semiconductor apparatus as set forth in claim 6, wherein said IC chip has a rectangular shape, and wherein the plurality of said first conductive leads include a pattern that extends from both a longer side and a shorter side of said IC chip.

8. The semiconductor apparatus as set forth in claim 6, wherein the base film is disposed between the extending part of the plurality of said first conductive leads and the IC chip.

9. The semiconductor apparatus as set forth in claim 8, wherein an opening portion for connecting said IC chip and at least some of the plurality of said first conductive leads and the plurality of said second conductive leads are formed in the base film.

10. The semiconductor apparatus as set forth in claim 9, wherein the opening portion is formed as a common slit to said some of the plurality of said first conductive leads and the plurality of said second conductive leads.

11. The semiconductor apparatus as set forth in claim 6, wherein the sealing member for sealing said IC chip is formed in the mounting region, and wherein the extending part of the plurality of said first conductive leads is not covered with the sealing member.

12. An electronic apparatus, comprising:

a semiconductor apparatus having an IC chip mounted on a main surface of a base film at a mounting region, a plurality of first conductive leads disposed at an edge of the mounting region of the IC chip and connected to the IC chip, and a plurality of second conductive leads disposed at another edge of the mounting region of said IC chip and connected to said IC chip; and a circuit board having an electronic device connected to said semiconductor apparatus and driven therewith, wherein at least a part of the plurality of said first conductive leads extends from where connected with the IC chip toward an inner portion of the mounting region; and further including a sealing member for the main surface and the IC chip, wherein an edge of the base film along the extending direction of the part of the plurality of said first conductor leads is in contact with an edge of the sealing member.

* * * * *